United States Patent [19]

Handa et al.

[11] Patent Number: 5,239,600
[45] Date of Patent: Aug. 24, 1993

[54] OPTICAL DEVICE WITH AN OPTICAL COUPLER FOR EFFECTING LIGHT BRANCHING/COMBINING BY SPLITTING A WAVEFRONT OF LIGHT

[75] Inventors: Yuichi Handa, Atsugi; Mitsutoshi Hasegawa, Yokohama, both of Japan

[73] Assignee: Canon Kabushiki Kaisha, Tokyo, Japan

[21] Appl. No.: 777,193

[22] Filed: Oct. 16, 1991

[30] Foreign Application Priority Data

Oct. 17, 1990 [JP] Japan ............... 2-278003

[51] Int. Cl.[5] ............... G02B 6/00
[52] U.S. Cl. ............... 385/48
[58] Field of Search ............... 385/31, 43–45, 385/47–48

[56] References Cited

U.S. PATENT DOCUMENTS

| | | | |
|---|---|---|---|
| 4,176,908 | 12/1979 | Wagner | 385/47 |
| 4,456,329 | 6/1984 | Henderson et al. | 385/44 |
| 4,575,180 | 3/1986 | Chang | 385/47 |
| 4,708,423 | 11/1987 | Erman et al. | 385/47 X |
| 4,765,706 | 8/1988 | Marcatilli et al. | 385/44 X |
| 4,776,661 | 10/1988 | Handa | 350/96.19 |
| 4,793,675 | 12/1988 | Handa | 350/96.13 |
| 4,888,785 | 12/1989 | Lee | 372/50 |

FOREIGN PATENT DOCUMENTS

| | | |
|---|---|---|
| 0237237 | 9/1987 | European Pat. Off. |
| 0362789 | 4/1990 | European Pat. Off. |
| 59-216107 | 12/1984 | Japan. |
| WO90/02349 | 3/1990 | PCT Int'l Appl. |

OTHER PUBLICATIONS

Fattah et al., "Semiconductor interferometric laser," Applied Physics Letters, vol. 41, No. 2, Jul. 15, 1982, pp. 112-114.

Salzman et al., "Cross coupled cavity semiconductor laser," Applied Physics Letters, vol. 52, No. 10, Mar. 7, 1988, pp. 767-769.

*Primary Examiner*—Akm E. Ullah
*Attorney, Agent, or Firm*—Fitzpatrick, Cella, Harper & Scinto

[57] ABSTRACT

An optical device includes a channel or three-dimensional light waveguide for propagating a light wave therethrough and an optical coupler for effecting at least one of branching and combining of the light wave by splitting a wavefront of a field distribution of the light wave. The coupler is produced by forming a portion whose reflection factor is different from the waveguide, extending in a vertical direction of the waveguide. The portion of different reflection factor is formed deep enough in the vertical direction to perform the splitting of the wavefront of the field distribution of the light wave with respect to at least a horizontal or lateral direction, or the portion of different reflection factor is formed at a flat portion of the waveguide.

11 Claims, 17 Drawing Sheets

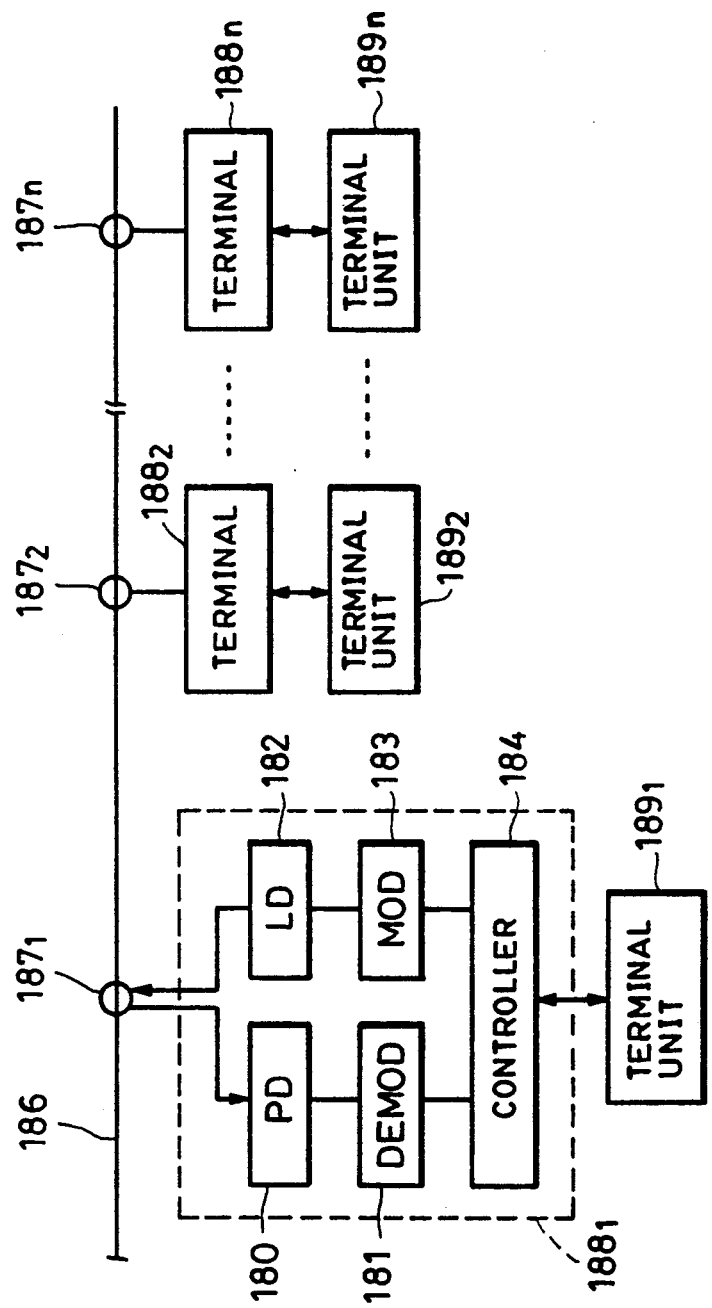

OPTICAL DEVICE WITH AN OPTICAL COUPLER FOR EFFECTING LIGHT BRANCHING/COMBINING BY SPLITTING A WAVEFRONT OF LIGHT

BACKGROUND OF THE INVENTION

1. Field of the Invention

The present invention relates to an optical device for use in opto-electrical integrated circuits and the like which are needed in fields of optical communication, and particularly, to an optical device with an optical coupler formed in a channel waveguide for effecting light wave branching and/or combining by splitting a wavefront of a propagating light wave. The present invention also relates to a method for forming an optical coupler in a channel waveguide of an optical device.

2. Related Background Art

In recent years, there has been presented an interferometric laser, which is a kind of compound-resonator laser including a Y-branch optical coupler 200 as shown in FIG. 1. The interferometric laser comprises a structure of layers layered as shown in FIG. 1 (see I. H. A. Fattah et al. "Semiconductor Interferometric Laser" Appl. Phys. Lett. 41, 2, pp. 112-114 (July 1982)).

Further, interferometric lasers respectively including X-branch optical couplers 210a and 210b as shown in FIGS. 2A and 2B have also been presented (see J. Salzman et al. "Cross Coupled Cavity Semiconductor Laser" Appl. Phys. Lett. 52, 10, pp. 767-769 (March 1988)). In FIGS. 2A and 2B, reference letters $R_1$-$R_4$ designate resonance or cavity surfaces, reference letters $L_1$-$L_4$ designate resonator lengths and reference letters r and t respectively indicate light reflection and transmission.

These two prior art devices, however, have the following disadvantages.

In the device of FIG. 1 including the Y-branch optical coupler 200, there are problems that the branching angle of the Y-branch coupler 200 cannot be made large and that the size of such device will inevitably be large (i.e., the length of the device will be more than 1 mm) compared with other optical devices, so that integration thereof with other devices is difficult to realize.

In the devices of FIGS. 2A and 2B including the X-branch optical couplers, there are problems that high process accuracies such as a high position accuracy and a high depth accuracy are required in producing the X-branch couplers 210a and 210b for achieving desired reflection and transmission efficiencies, so that yield as well as reproducibility of such devices is low. That is, the property of light branching and combining is determined by how the X-branch coupler is formed relatively to a field distribution or field amplitude variation of a light wave propagating in a light waveguide. Therefore, the process accuracies need to be high and strict considering the state of the field distribution of light.

A more detailed explanation will now be made of the prior art devices of FIGS. 2A and 2B, referring to FIGS. 3, 4A and 4B. The optical coupler for effecting branching and combining of a light wave propagated in crossing waveguides is produced by forming a fine slit 211 extending in a direction of layered layers or a vertical direction, at a cross portion of waveguides 212 and 212' as shown in FIG. 3.

However, in the prior art device, there is a light confinement structure in a direction parallel to a plane defined by the layered layers or a lateral direction of the light waveguide (typically, a ridge type structure), so that the cross portion before the slit 211 is formed is not flat. As a result, the tip depth of the slit 211 at its central portion B is greatly different from that at its opposite end portions A and C, as shown in FIG. 4B. The difference in the tip depth of the slit 211 makes it difficult to control the coupling efficiency and the branching ratio of light because the field distribution 219 of the propagating light wave generally expands wider than the width of the light waveguide, as shown in FIG. 4B.

In FIGS. 4A and 4B respectively showing cross-sections of FIG. 3 taken along a line A—A' and a line B—B', reference numeral 213 is a substrate, reference numerals 214 and 216 are clad layers, reference numeral 215 is a core layer of the waveguide, reference numerals 217 and 219 are respectively field distributions in the light waveguide with respect to A—A' and B—B' cross sections and reference numeral 218 is a ridge portion for forming the light waveguide. When the slit 211 is formed at the cross portion of the ridge waveguide by focused ion beam etching (FIBE), reactive ion beam etching (RIBE) or the like, the tip depth of the slit 211 varies in the lateral direction. As a result, even if the tip depth of the slit 211 is set to a central portion of the field distribution at its central part B so that the slit 211 divides the field distribution 219 at its central portion in the direction of layered layers, the tip depth becomes too deep at opposite end parts A and C since no ridge portion 218 is there. Hence, the reflection efficiency becomes large differently from a desired one. Thus, it is extremely difficult to control the tip depth of the slit 211 for obtaining a desired branching efficiency. That is, it is difficult to control a splitting ratio or ratio of transmission/reflection by the tip position of the slit 211.

Further, an irregularity of the tip depth of a slit more or less exists in an embedded waveguide structure since a step or the like is created at the time of an embedding process.

SUMMARY OF THE INVENTION

An object of the present invention is to provide an optical device with a wavefront splitting type optical coupler in which controllability of the depth of a slit or recess for constituting the optical coupler is improved for achieving a desired branching ratio and a coupling or combining efficiency.

Another object of the present invention is to provide an optical device with a wavefront splitting type optical coupler which has such a structure that enhances the uniformity of the tip depth of a slit or recess for constituting the optical coupler for easily and accurately control a branching ratio and a coupling efficiency.

A third object of the present invention is to provide an optical device with a wavefront splitting type optical coupler which can easily and accurately be formed for achieving a desired branching ratio and a coupling efficiency to increase its reliability and reproducibility.

According to one aspect of the optical device of the present invention, the optical device comprises a channel or three-dimensional light waveguide for propagating a light wave therethrough and an optical coupler for effecting at least one of branching and combining of the light wave by splitting a wavefront of a field distribution of the light wave. The coupler is produced by forming a portion whose reflection factor is different from the waveguide, extending in a vertical direction of the waveguide, and the portion is arranged so that controllability of a tip depth thereof in the waveguide is high enough to achieve a desired reflection/transmission ratio without difficulties.

According to another aspect of the optical device of the present invention, the optical device comprises a channel or three-dimensional light waveguide for propagating a light wave therethrough and an optical coupler for effecting at least one of branching and combining of the light wave by splitting a wavefront of a field distribution of the light wave. The coupler is produced by forming a portion whose reflection factor is different from the waveguide, extending in a vertical direction of the waveguide, and the portion is formed deep enough in the vertical direction to perform the splitting of the wavefront of the field distribution of the light wave with respect to at least a horizontal or lateral direction.

According to still another aspect of the optical device of the present invention, the optical device comprises a channel or three-dimensional light waveguide for propagating a light wave therethrough and an optical coupler for effecting at least one of branching and combining of the light wave by splitting a wavefront of a field distribution of the light wave. The coupler is produced by forming a portion whose reflection factor is different from the waveguide, extending in a vertical direction of the waveguide, at a flat portion of the waveguide.

According to one aspect of a method for producing an optical coupler in an optical device comprising a channel light waveguide for propagating a light wave therethrough and an optical coupler for effecting at least one of branching and combining of the light wave by splitting a wavefront of a field distribution of the light wave, of the present invention, the method comprises a step of forming a flat portion in the waveguide and a step of forming a portion whose reflection factor is different from the waveguide, extending in a vertical direction of the waveguide, at the flat portion of the waveguide.

These advantages and others will be more readily understood in connection with the following detailed description, claims and drawing.

BRIEF DESCRIPTION OF THE DRAWINGS

FIG. 27 is a block diagram showing an example of optical communication systems in which the optical semiconductor device of the present invention is used as an optical node, a light receiver, a light transmitter, or the like.

DESCRIPTION OF THE PREFERRED EMBODIMENT

Figure 5:
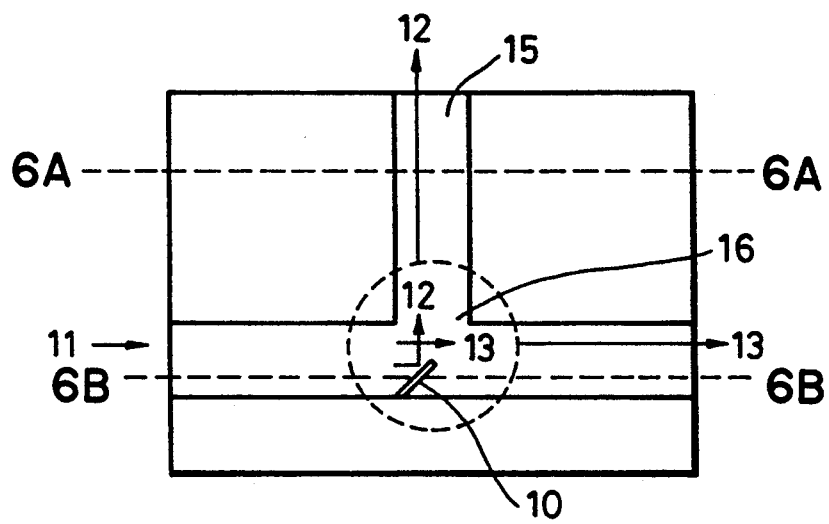
FIG. 5 is a plan view of a first embodiment of the present invention.
Figure 6A:
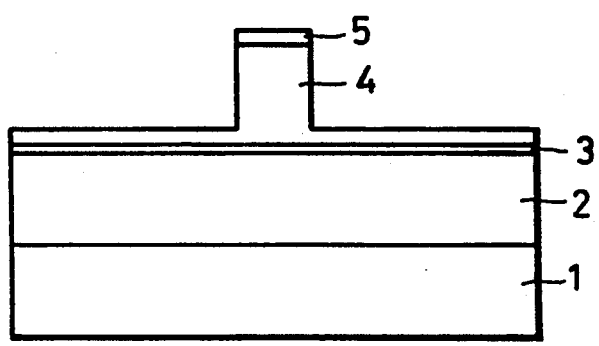
FIG. 6A is a cross-sectional view taken along a line A—A'0 of FIG. 5.
Figure 6B:
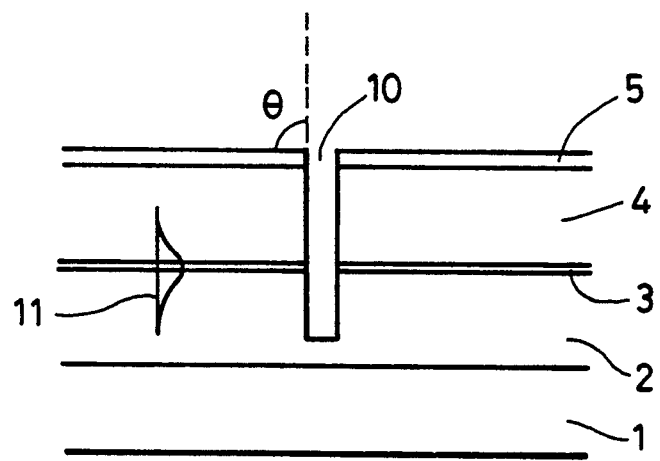
FIG. 6B is a cross-sectional view taken along a line B—B' of FIG. 5.
Figure 7:
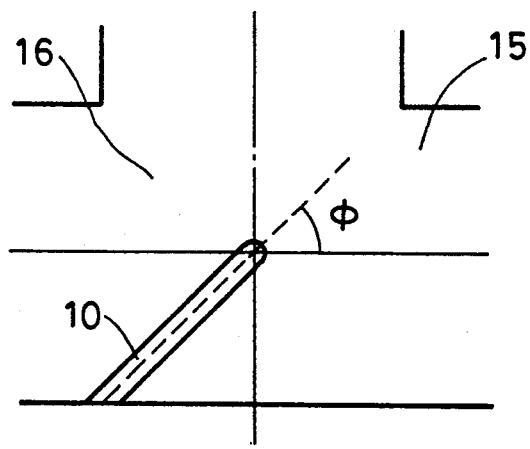
FIG. 7 is an enlarged plan view of a portion of the first embodiment of the present invention.

FIG. 5 illustrates a first embodiment of the present invention which is an optical semiconductor device including a T-branch coupler. FIGS. 6A, 6B and 7 respectively show an A—A' cross-sectional view of FIG. 5, a B—B' cross-sectional view of FIG. 5 and an enlarged partial view of FIG. 5.

A process for fabricating the first embodiment will be explained hereinbelow.

Epitaxial layers comprising a first clad layer 2, an active layer 3, a second clad layer 4 and a cap layer 5 are grown on a substrate 1 in this order by the molecular beam epitaxy (MBE) method. A buffer layer of GaAs may be formed at a boundary between the substrate 1 and the epitaxial layers, when necessary. The thickness of the first and second clad layers 2 and 4 is 1 μm, and the thickness of the active layer 3 is about 0.1 μm. Then, a desired pattern of 3 μm width (a T-type pattern in this case) is formed on the epitaxial layers by the photolithography process, and a ridge portion (see FIG. 6A) is formed by reactive ion beam etching (RIBE). Thus, a stripe structure is produced for performing a lateral confinement of light, as shown in FIGS. 5 and 6A.

Further, a slit groove 10 penetrating the active layer 3 is formed by focused ion beam etching (FIBE) as shown in FIG. 6B. The inclination angle $\theta$ of the end surface of the slit groove 10 is more than 85 degrees (see FIG. 6B), and the groove 10 extends from the center of a branching/combining portion 16 in a ridge type waveguide 15 at an angle $\phi=45°$ relative to a light wave propagating direction as shown in FIG. 7. Thus, a 45° mirror or total reflection mirror 10 is obtained.

Then, end surfaces of the device are cleaved to form light incident and emitting end surfaces.

A light wave 11 incident on the active layer 3 in a direction of the B→B' line as shown in FIG. 5 is branched into a reflected light wave 12 and a transmitted light wave 13 at the branching/combining portion 16 in an equal ratio by the total reflection mirror 10. Here, the light wave 12 is created by the total reflection at a lower half part (i.e., slit groove 10) of the branching/combining portion 16 shown in FIG. 7, while the light wave 13 is generated by the transmission at an upper half part (i.e., portion without the slit groove 10) of the branching/combining portion 16 shown in FIG. 7.

Since the optical coupler 16 which is the branching/combining portion of the first embodiment is a branching coupler of a wavefront division or splitting type solely with respect to a horizontal direction (an extending direction of the substrate 1 on which the channel waveguide structure 15 is formed), no strict process control to a positional accuracy of the tip depth of the slit groove 10 is needed so long as the etching of the end surface of the slit groove 10 is performed well beyond the active layer 3 (the layer which is a central part of the channel waveguide 15 in the vertical direction). Instead of controlling the tip depth, a ratio between transmission and reflection of the light wave can be set to a desired value by controlling the position and extension of the 45° mirror 10 in the horizontal direction.

In the first embodiment, the ridge waveguide 15 is adopted as a channel waveguide structure, but a refractive index type or the like can also be used.

Figure 8:
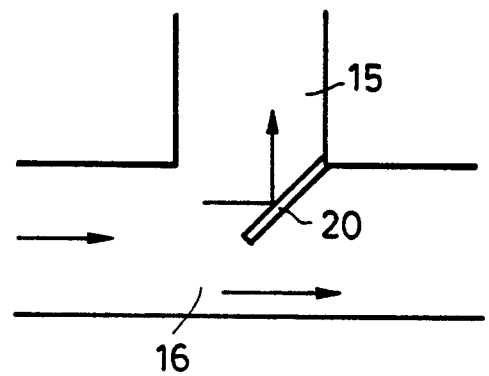
FIGS. 8 and 9 are respectively plan views of modifications of the first embodiment.
Figure 9:
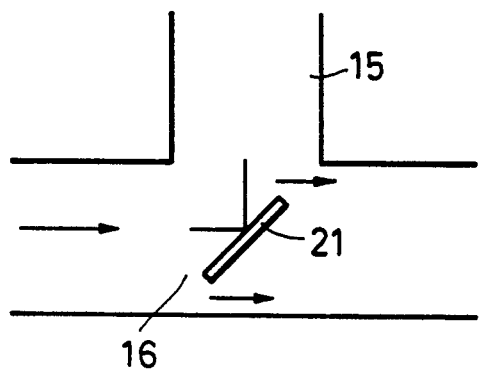

FIGS. 8 and 9 show modifications of the first embodiment. In a T-coupler of FIG. 8, a slit groove 20 is formed at a portion of the waveguide 15 at which the transmitting portion is formed in the first embodiment of FIG. 5. In a T-coupler of FIG. 9, a slit groove 21 is formed at a central portion of the branching/combining portion 16, inclining at 45° relative to the light propagating direction. The operation of those modifications is substantially the same as that of the first embodiment.

Figure 10:
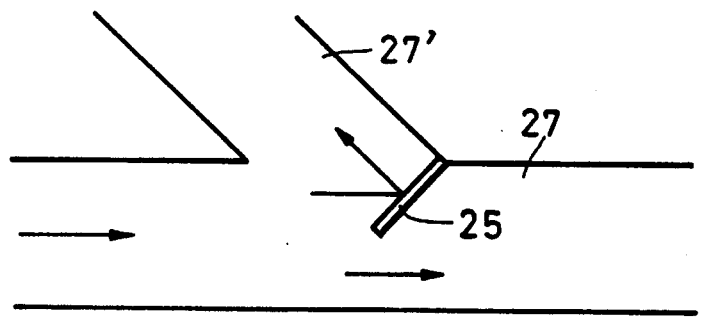
FIG. 10 is a plan view of a second embodiment of the present invention.

FIG. 10 shows a second embodiment of a Y-branch coupler. In the second embodiment, a slit groove 25 is formed inclining at proper angles relative to the light propagating direction of a waveguide 27' branching from a main waveguide 27. The light wave is branched or combined as shown by arrows of FIG. 10. The slit groove 25 is deep enough to penetrate the active layer.

Figure 11:
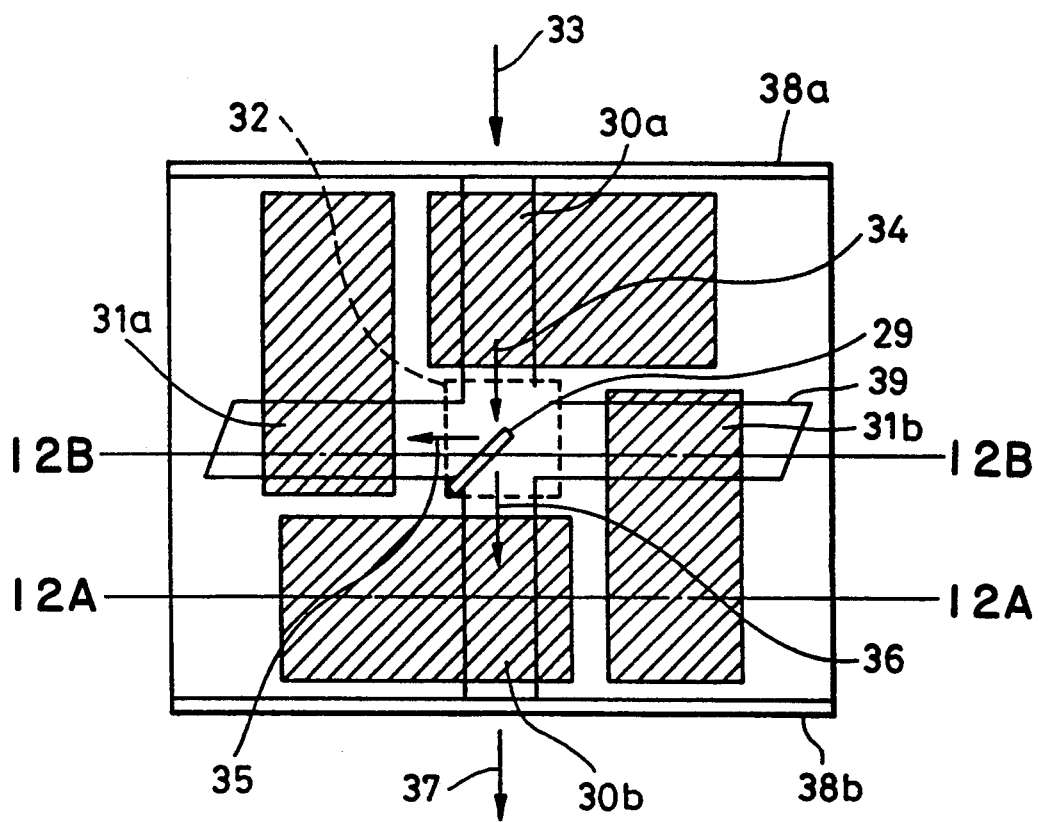
FIG. 11 is a plan view of a third embodiment of the present invention.
Figure 12:
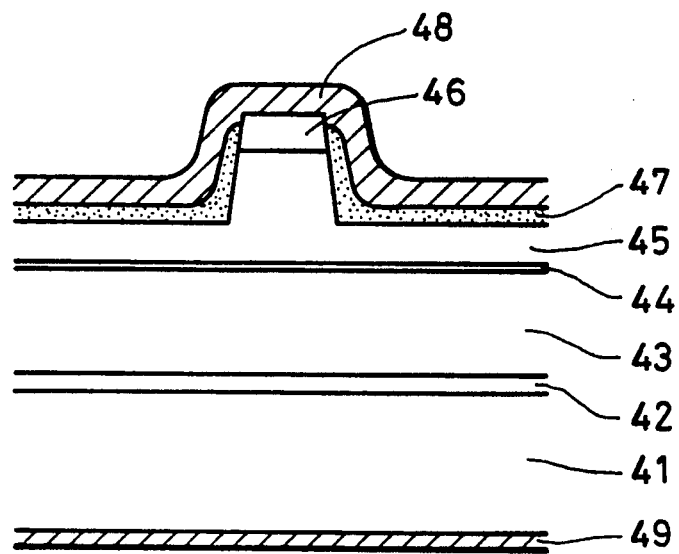
FIG. 12 is a cross-sectional view taken along a line A—A' of FIG. 11.
Figure 13:
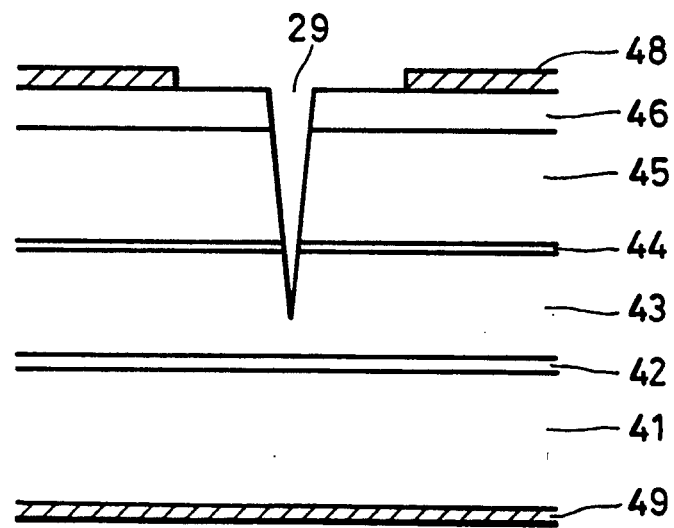
FIG. 13 is a cross-sectional view taken along a line B—B' of FIG. 11.

FIG. 11 shows a third embodiment of an optical node in which a transmitter and a receiver is provided. FIGS. 12 and 13 respectively show an A—A' section and a B—B' section of FIG. 11.

The third embodiment is directed to an integrated coupler in which the etched end surface of the slit groove of the first embodiment is used.

In FIG. 11, there provided a slit groove 29 formed at a branching/combining portion 32 of a waveguide 39 by focused ion beam etching (FIBE), amplifier areas 30a and 30b obtaining a gain by a current injection thereinto and having a optical amplifier (not shown), photodetector areas 31a and 31b having a photodetector (not shown) which operates by a reverse bias voltage, AR (anti-reflection) coats 38a and 38b formed at end surface of the device by depositing $Al_2O_3+ZrO_2$ by electron beam (EB) deposition.

The waveguide 39 is formed on an upper surface of the device in a crisscross shape. The amplifier areas 30a and 30b are formed on a vertically (on the sheet of FIG. 11) extending part of the waveguide 39, while the photodetector areas 31a and 31b are formed on a horizontally extending part of the waveguide 39. The slit groove 29 is formed inclining at 45° relative to the vertically and horizontally extending parts of the waveguide 39 and extends between a left lower end of the integrated coupler portion 32 indicated by dotted lines and a central part thereof.

The fabrication process of the third embodiment is as follows. In FIGS. 12 and 13, there are grown, on an n-type GaAs substrate 41, an n-type GaAs layer 42 of 1 $\mu$m thickness which is a buffer layer and an n-type $Al_{0.4}Ga_{0.6}As$ layer 43 of 1.5 $\mu$m thickness which is a clad layer. Further, an undoped GaAs of 100 Å thickness and an $Al_{0.2}Ga_{0.8}As$ of 30 Å thickness are layered four times repeatedly and then a GaAs of 100 Å thickness is layered to form an active layer 44 of multiple quantum well (MQW) structure. Thereon, a p-type $Al_{0.4}Ga_{0.6}As$ layer 45 of 1.5 $\mu$m thickness which is an upper clad layer and a GaAs layer 46 of 0.5 $\mu$m which is a cap layer are formed.

Next, a desired crisscross mask pattern (pattern of the waveguide 39) of 3 $\mu$m width is formed on the semiconductor laser wafer by the photolithography process, and the etching is performed to a location of 0.2 $\mu$m above the active layer 44, through the mask by RIBE in a $Cl_2$ gas atmosphere. Thus, a ridge portion is formed to fabricate a stripe structure for conducting the light confinement in the lateral direction.

Then, an insulating layer 47 of 1200 Å thickness is formed on the laser wafer with the ridge portion, by plasma CVD method, and resist of about 1.0 $\mu$m thickness is spin-coated on the SiN insulating layer 47. Only the resist on the cap layer 46 is removed by RIBE method in an $O_2$ atmosphere of 4 Pa to expose the SiN insulating layer 47 on the top of the ridge. The exposed SiN insulating layer on the top of the ridge is selectively etched by RIBE method in a $CF_4$ gas atmosphere of 4 Pa. Then, the remaining resist is removed by RIBE method in an $O_2$ atmosphere of 4 Pa.

A surface-oxidized layer formed on the top of the ridge is wet-etched by hydrochloric acid to form a current injection window. Then, a Cr-Au ohmic electrode 48 serving as an upper electrode is formed by the vacuum deposition method, and an AuGe-Au electrode 49 serving as an n-type ohmic electrode is deposited after the GaAs substrate 41 is cut by the lapping to 100 $\mu$m thickness. A thermal treatment is performed for achieving ohmic contact of the p-type and n-type electrodes 48 and 49. Thus, the ridge type semiconductor device is obtained.

The slit groove 29 of the coupler portion 32 is formed as shown in FIGS. 11 and 13 by the etching of FIB method using $Ga^+$ ions in an acceleration voltage of 40 KeV. The slit groove 29 is inclined as discussed above and its depth is larger than a length from the surface of the waveguide 39 to the active layer 44 by 1 $\mu$m as shown in FIG. 13. The inclination angle of the end surface of the slit groove 29 is set to more than 85°.

Resonance surfaces are formed by cleavage, and the AR coats 38a and 38b are formed by electron beam (EB) deposition of Al$_2$O$_3$+ZrO$_2$. Then, the wafer is divided by the scribing, and the electrodes 48 and 49 (hatching patterns in FIG. 11 indicate patterns of electrode 48) are electrically drawn out by the wire-bonding.

The operation of the third embodiment will be explained hereinbelow.

An incident light wave 33 is amplified by the amplifier area 30a, and the amplified light wave is incident on the integrated coupler 32 as an incident wave 34 thereon. The incident wave 34 is branched into a transmitted wave 36 and a reflected wave 35 as explained in the first embodiment. The reflected wave 35 is photoelectrically converted in the photodetector area 31a, and a signal component of the light wave 33 is monitored. On the other hand, the transmitted wave 36 is further amplified in the amplifier area 30b and is emitted as an emission light 37. When a light wave is incident in the opposite direction, namely, through the AR coat 38b, the monitoring is conducted in the photodetector area 38b. The other amplification operations are the same as the abovementioned case.

When optical amplification factors (gains) are set to compensate for losses in the coupler 32 and coupling losses at the end surfaces, an optical node for receiving light without any apparent losses is achieved and a multi-step connection of the nodes becomes possible.

The optical node may include a light transmitter portion as well as the above-mentioned receiver portion, so that the optical node becomes capable of light receiving and light transmission.

Figure 14:
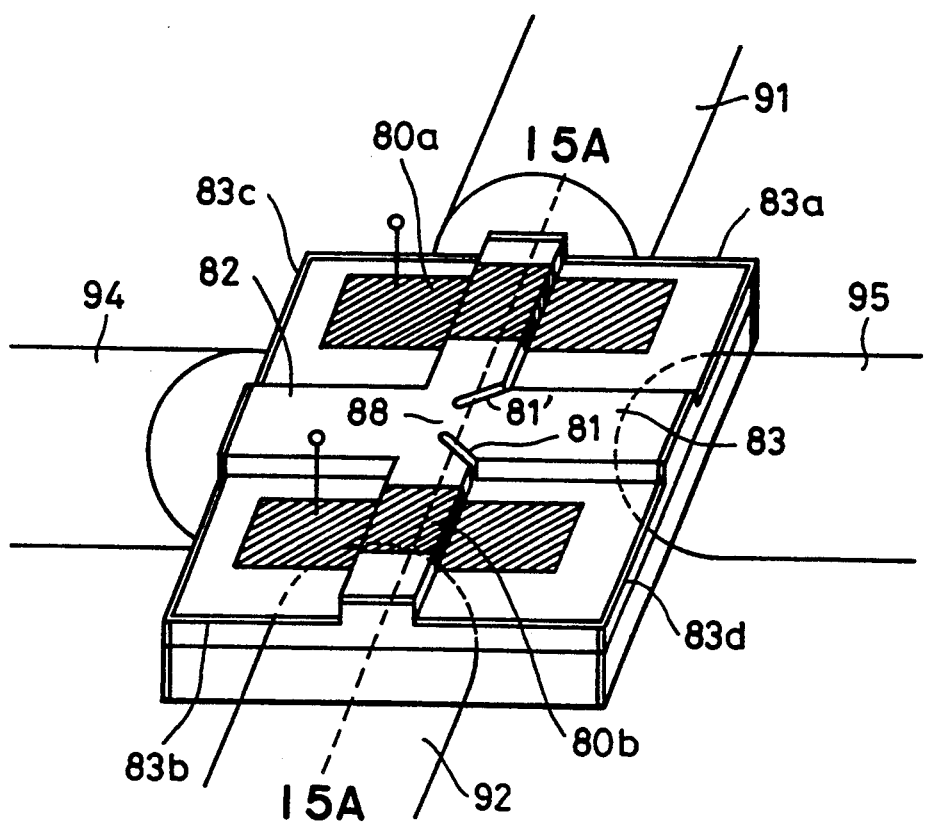
FIG. 14 is a perspective view of a fourth embodiment of the present invention.
Figure 15:
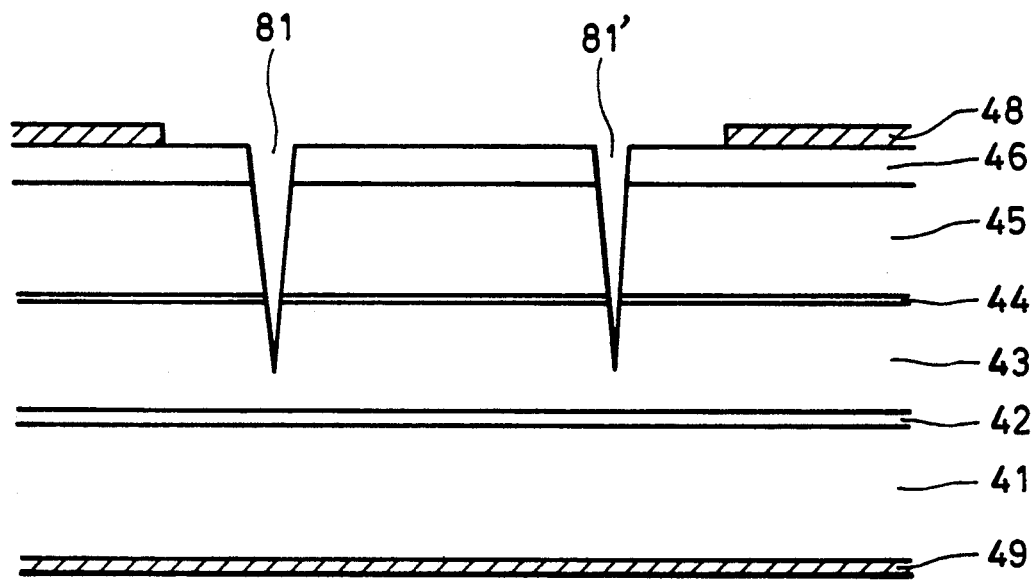
FIG. 15 is a cross-sectional view taken along a line A—A' of FIG. 14.

FIG. 14 shows a fourth embodiment of the present invention, and FIG. 15 shows a section of a coupler portion taken along a line A—A' of FIG. 14.

In the fourth embodiment, there are provided optical amplification portions 80a and 80b arranged in a bus-line direction, and waveguides 82 and 83 branching towards a light receiving portion and a transmission portion intersect a waveguide extending in the bus-line direction. A branching coupler 88 includes a pair of slit grooves 81 and 81' formed in a tapering shape at a cross portion to perform branching and combining. A ratio of branching and combining can be adjusted by controlling an electro-magnetic field distribution of light propagated through the waveguide, the length and position of the grooves 81 and 81', etc. The grooves 81 and 81' are formed by a fine process technology such as Ga focused ion beam (FIB) etching and reactive ion beam etching (RIBE).

Portions other than the branching coupler portion 88 can be formed in the same way as the third embodiment.

In FIG. 14, there are provided an Ar coat 83a abutting the end surface of a fiber 91, an AR coat 83b abutting the end surface of a fiber 92, an AR coat 83c abutting the end surface of a fiber 94 at the side of the receiver portion and an AR coat 83d abutting the end surface of a fiber 95 at the side of the transmitter portion. In FIG. 15, the same reference numerals as those in FIG. 13 designate the same members or portions as those in FIG. 13.

The branching ratio towards the left side waveguide 82 of the tapered branching coupler 81 and 81' is different from that towards the right side waveguide 83. Generally, in order to increase the coupling towards the receiver portion, a narrow side of the tapered grooves 81 and 81' faces the receiver side waveguide 82. When the branching ratio of the groove is −3 dB and an excess loss is neglected, the branching ratio to the receiver portion side is −3 dB and that to the transmitter portion side is −6 dB. Further, since the reflection of −6 dB exists when light enters a wide portion of the tapered grooves 81 and 81', an isolator (not shown) is needed to stabilize the radiation frequency at the side of the receiver portion.

The operation of the fourth embodiment will be explained.

A light wave incident on the AR coat 83a through the optical fiber 91 is amplified by the amplifier portion 80a, and enters the integrated coupler portion 88. The amplified incident light wave is branched into a light wave entering the waveguide 82 towards the left side receiver portion, a light wave entering the waveguide 83 towards the right side transmitter portion (this is blocked by the above-mentioned isolator) and a light wave entering the amplifier portion 80b, by the slit grooves 81 and 81' which respectively transmit and reflect light and a portion without the groove. A signal of the light wave entering the receiver portion through the fiber 94 is detected thereat, and the light wave entering the amplifier portion 80b is amplified thereat to be output into the fiber 92. The same is true with respect of light wave incident on the AR coat 83b.

A light wave entering the coupler 88 through the fiber 95 and the waveguide 83 from the transmitter is branched into light waves entering the waveguides 82 and 83 (light wave reflected back to the waveguide 83 is blocked by the isolator) and light waves entering the amplifier portions 80a and 80b, by the slit grooves 81 and 81' which transmit and reflect light and the portion without the groove. A signal of the light wave entering the receiver portion through the fiber 94 and the waveguide 82 is detected thereat, and the light waves entering the amplifier portions 80a and 80b are amplified thereat to be output into the fibers 91 and 92, respectively.

In the above-discussed embodiments, the resonance ends are formed by the cleavage, but an etched end surface may be used which is formed by dry etchings such as RIBE method and reactive ion etching (RIE).

In the above-discussed embodiments, the active region comprises a multiple quantum well (MQW) structure, but an active region may be produced by double-hetero (DH) structure, single quantum well (SQW) structure, or the like.

In the above-discussed embodiments, the waveguide is formed as a ridge waveguide using GaAs group, but an index waveguide types such as a buried hetero-stripe (BH) structure, a channel substrate planar stripe (CPS) structure, a structure in which an absorption layer for constricting current is formed near an active layer can also be used effectively. Further, gain waveguide types such as a stripe electrode type, a proton bombard type, and the like are also effective.

The GaAs/AlGaAs group is used in the above-discussed embodiments, but other material such as InP/InGaAsP group, AlGaInP group and the like may be used similarly.

Figure 1:
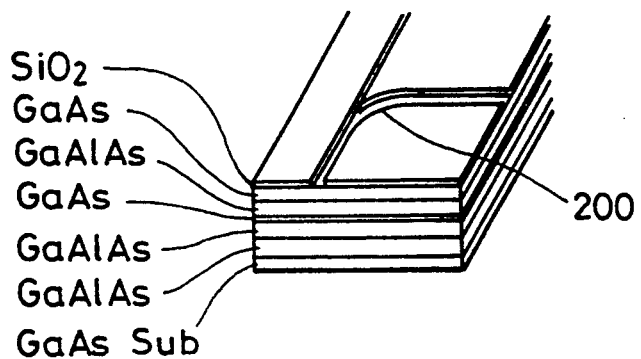
FIG. 1 is a perspective view of a first prior art device.
Figure 2A:
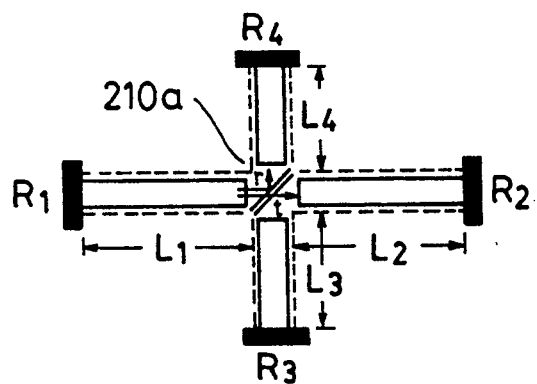
FIGS. 2A and 2B are plan views illustrating two kinds of second prior art devices, respectively.
Figure 2B:
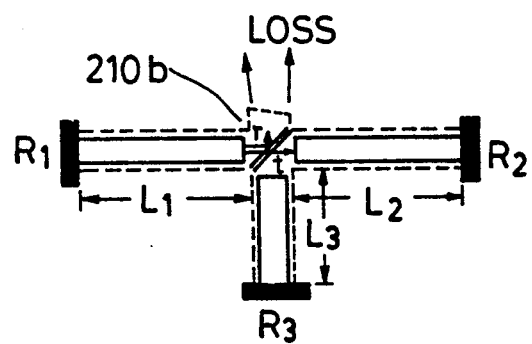
Figure 3:
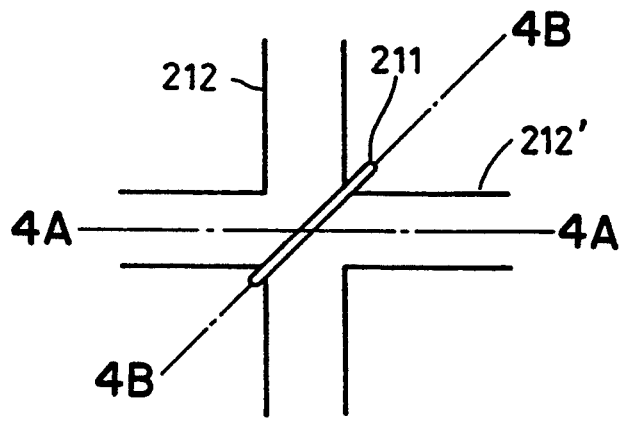
FIG. 3 is a plan view for explaining the second prior art devices in more detail.
Figure 4A:
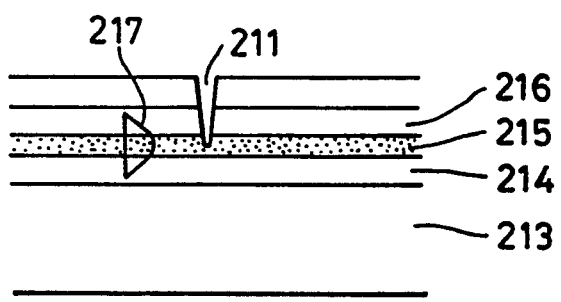
FIG. 4A is a cross-sectional view taken along a line A—A' of FIG. 3.
Figure 4B:
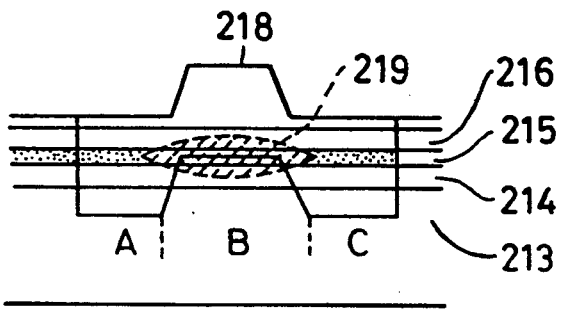
FIG. 4B is a cross-sectional view taken along a line B—B' of FIG. 3.

In the above-discussed embodiments, such a structure as performs a wavefront division of a field distribution at least in a horizontal direction is adopted, so that there is no need to strictly set the accuracy of a wavefront division in a direction of depth or vertical direction. Thus, optical couplers such as Y and X-branch couplers can be fabricated by establishing the positional accuracy in the horizontal direction. Therefore, the integration is easy to realize compared with the prior art example of FIG. 1. Moreover, the process becomes easy compared to the prior art examples of FIGS. 2A and 2B, so that reliability and reproducibility are improved as well as the yield. Further, an opto-electrical integrated device including an optical coupler can easily be obtained.

Figure 16:
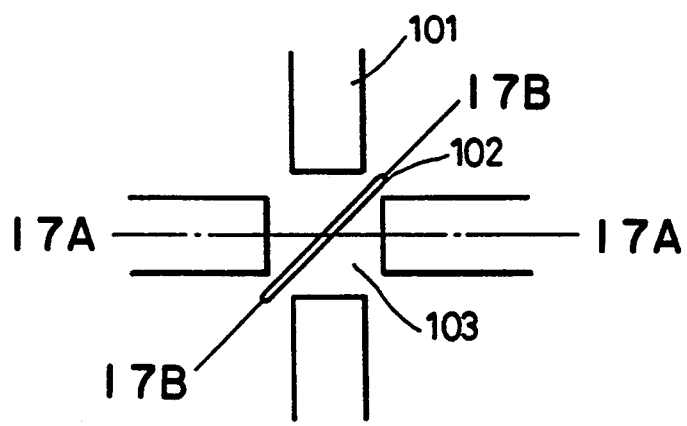
FIG. 16 is a plan view of a fifth embodiment of the present invention.
Figure 17A:
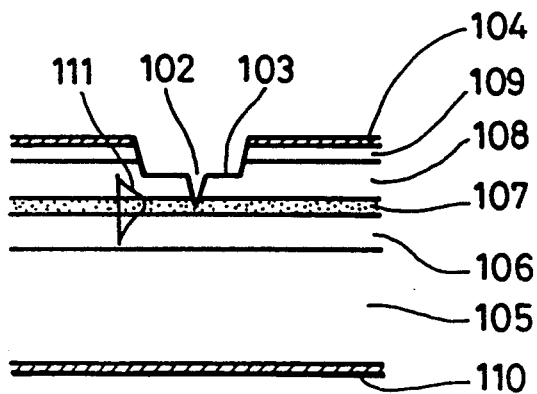
FIG. 17A is a cross-sectional view taken along a line A—A' of FIG. 16.
Figure 17B:
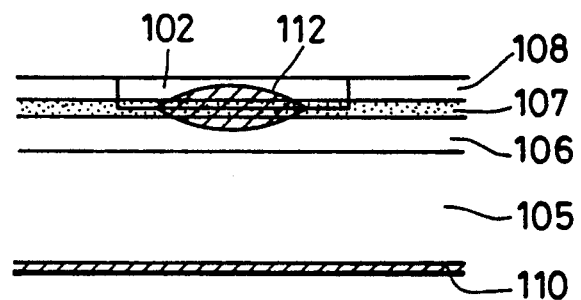
FIG. 17B is a cross-sectional view taken along a line B—B' of FIG. 16.

FIG. 16 shows a plan view of a fifth embodiment of the present invention. In FIG. 16, there are provided a ridge waveguide 101, a fine slit 102 constituting a coupler portion and a flat portion 103 formed at a cross portion of the waveguide 101. FIG. 17A shows a cross section of the device taken along a line A—A' of FIG. 16. There are formed, on an n-type GaAs substrate 105, an n-type AlGaAs clad layer 106, a GaAs active layer 107, a p-type AlGaAs clad layer 108, and a p+-GaAs cap layer 109 and an Au electrode 104. Another Au electrode 110 is formed on the bottom surface of the substrate 105. The tip end of the slit 102 is stopped at a central part of a field distribution 111 in a direction of layered layers (i.e., a portion of the active layer 107 at which the central part of the field distribution 111 is located) to perform the wavefront division with respect to the direction of layered layers or vertical direction. The slit 102 is formed at the flat portion 103, so that the uniformity of a tip depth of the slit 102 in a horizontal direction is excellent as shown in FIG. 17B which shows a cross section taken along a B—B' line of FIG. 16. The wavefront division in the direction of layered layers is performed accurately (in this case uniformly) over an entire field distribution 112 in the horizontal direction. As a result, the control of a branching ratio (ratio between a reflection component of the field distribution 112 overlapping the section of the slit 102 and a transmission component deviating from the section of the slit 102) becomes easy.

Figure 18:
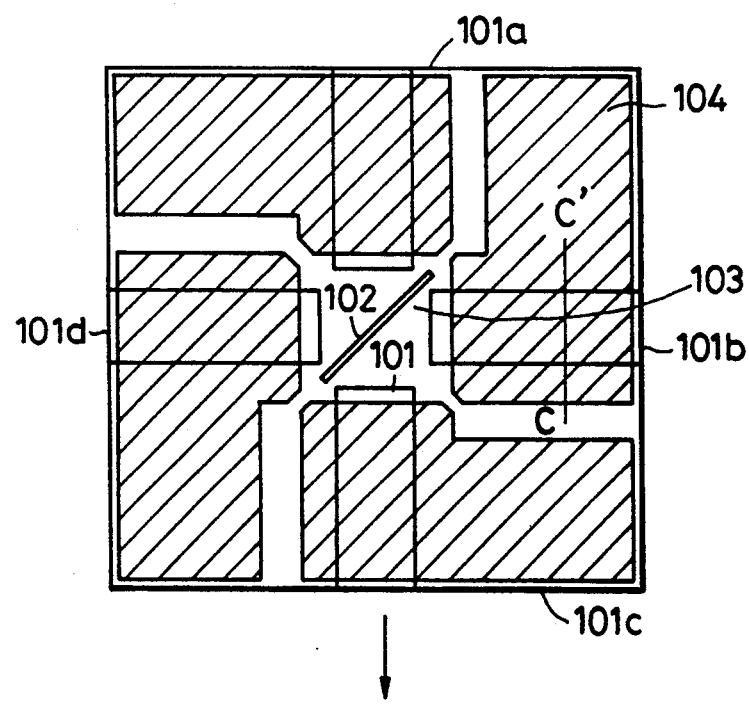
FIG. 18 is a plan view of an example in which a coupler of the fifth embodiment is applied to a branching-type interferometric laser.
Figure 19:
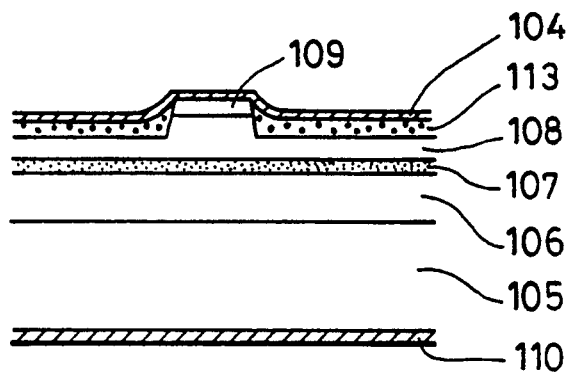
FIG. 19 is a cross-sectional view taken along a line C—C' of FIG. 18.

FIG. 18 shows an example in which the coupler of the first embodiment is applied to a branching-type interferometric laser that is a kind of compound resonator laser. Crisscross ridge waveguides 102 are formed, and outer waveguide ends 101a–101d are cleaved to be mirrors, respectively. On the top of the ridge, the electrodes 104 are formed in patterns indicated by hatchings in FIG. 18 to allow a current injection into the active layer 107. FIG. 19 shows a section of the ridge portion taken along a line C—C' of FIG. 18. The same reference numerals as those in FIG. 17A designate the same members or portions as those in FIG. 17A. A SiN$_x$ insulating layer 113 is provided at sides of the ridge in order to perform the current injection through the cap layer 109.

In the device of FIG. 18, a resonator in a horizontal direction is coupled with a resonator in a vertical direction through the coupler 102 to form the compound resonator type laser. Thus, a single longitudinal mode and stabilization of an oscillated spectrum are achieved.

The fabrication process of the fifth embodiment will be explained.

The n-clad layer 106 through the cap layer 109 are epitaxially formed on the n-GaAs substrate 105 by MBE or the like. The ridge waveguide pattern (a crisscross pattern) is formed by the photolithography, and the waveguide 101 is formed by RIBE. The SiN$_x$ layer 113 is layered on an entire surface, and the p+-GaAs cap layer 109 on the ridge is exposed. At this time, the SiN$_x$ layer 113 at the flat portion 103 is etched beforehand. Lastly, the substrate 105 is ground, and Au layers 104 and 110 are deposited on upper and lower surfaces. Then, alloying is conducted to obtain ohmic contacts.

The coupler portion 103 is formed by the etching of FIBE. The Ga+ beam is used as ions, and the acceleration voltage is 40 keV.

The four end surfaces 101a–101d are cleaved, and the wafer is mounted on a stem. Wire-bonding of the electrodes 104 is then effected.

In this embodiment, the coupler portion is located at the flat portion 103, so that the confinement in the lateral direction ceases thereat. As a result, light will diverge at the flat surface 103. But, coupling losses due to diffraction are almost negligible since the length of the coupler portion is restricted to several μm which is about equal to the ridge width.

Figure 20:
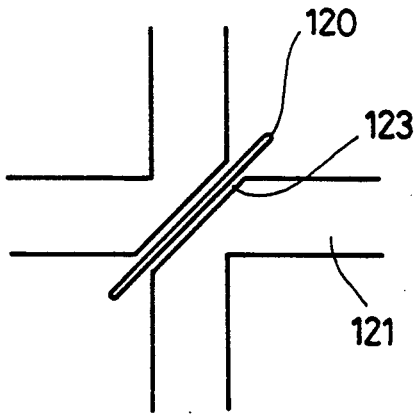
FIG. 20 is a plan view of a sixth embodiment of the present invention.

FIG. 20 shows a sixth embodiment of the present invention. In this embodiment, a flat portion 123 for forming a coupler has a shape of a groove that surrounds a slit 120. A portion in which confinement in the lateral direction is eliminated is reduced. Therefore, coupling losses due to diffraction and the like are further decreased. Losses due to absorption can also be reduced since current injection is possible immediately before the coupler portion. Reference numeral 121 designates a waveguide.

Figure 21:
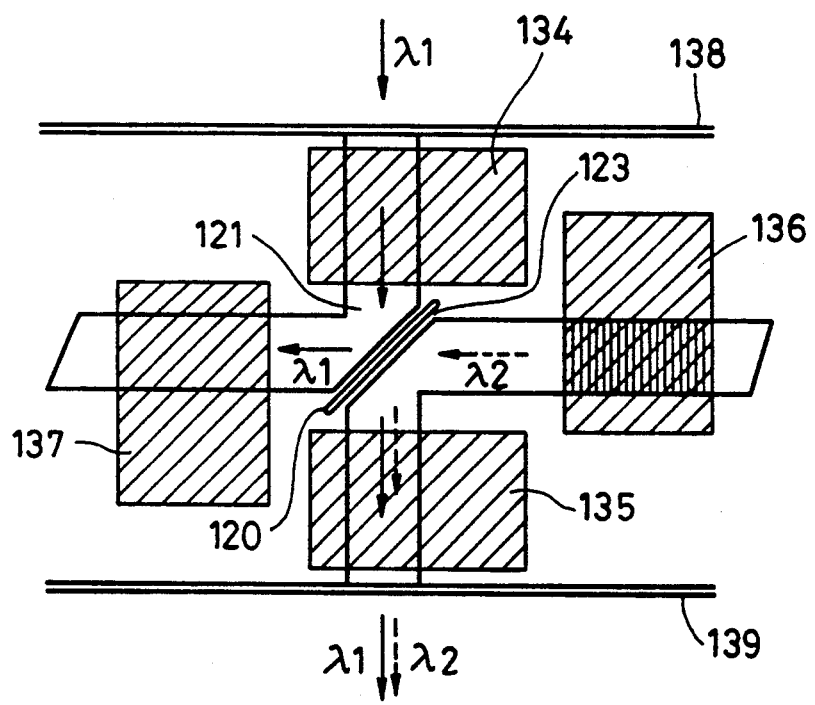
FIG. 21 is a plan view of an example in which a coupler of the sixth embodiment is applied to an optical amplifier having both transmitter and receiver functions.

FIG. 21 shows an example in which the coupler of the sixth embodiment is applied to an optical amplifier that contains transmitter and receiver portions. A ridge portion in a vertical (in the sheet of FIG. 21) direction constitutes optical amplifier portions 134 and 135 by current injection. AR coats 138 and 139 are formed on input and output end surfaces.

Light of a wavelength $\lambda_1$ enters the waveguide 121 through the AR coat 138 and is amplified by the optical amplifier portion 134 to reach the coupler portion 120. Power of the light is partly reflected to be detected by a photodetector in a receiver portion 137, while the remaining light is transmitted through the coupler 120 and amplified by the optical amplifier portion 135 to reach the output side.

The transmitter portion 136 constitutes a laser of distributed feedback (DFB) structure and supplies light wave of a wavelength $\lambda_2$ to the output side through the coupler 120. Thus, an optical integrated node capable of detection and transmission of an input signal and transmission of its own signal is achieved by the structure of integration containing the coupler 120.

Figure 22:
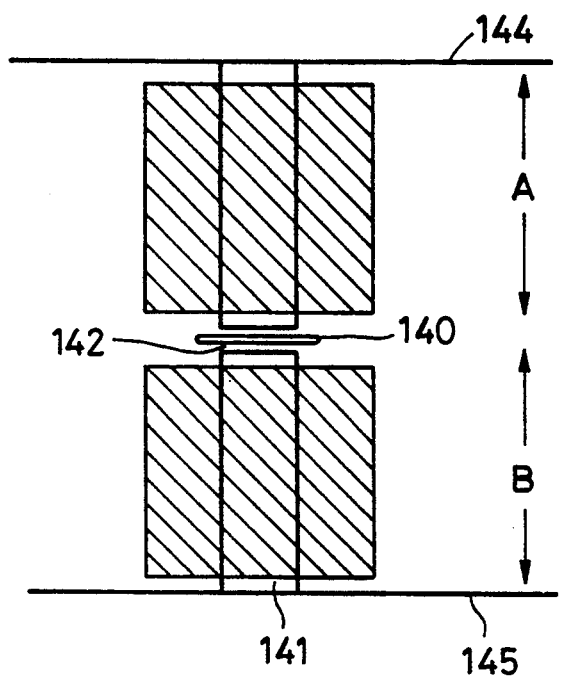
FIG. 22 is a plan view of a seventh embodiment of the present invention.

FIG. 22 shows a seventh embodiment of the present invention. In this embodiment, a coupler or slit 140 formed at a flat portion 142 forms an end surface perpendicular to a propagating direction of a waveguide 141 to control a ratio between reflection and transmission. The device structure of the seventh embodiment is a compound resonance type laser similarly to the example of FIG. 18 and a stable single longitudinal mode can be maintained. Namely, there are two compound resonators A and B including cleaved surfaces 144 and 145 and the coupler portion 140, and ripple intervals are made different from each other by finely adjusting the lengths of resonators A and B to reduce a beat frequency. As a result, the interval of spectra to be oscillated by the compound resonators can be made large to attain a stable longitudinal mode.

Figure 23:
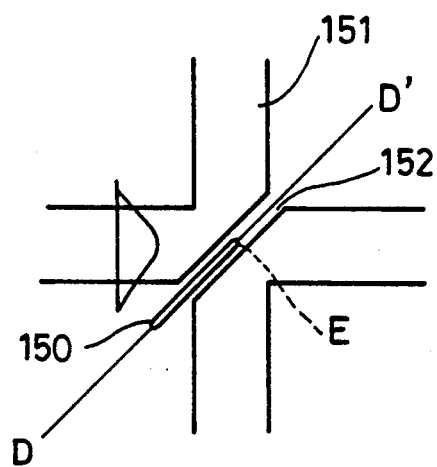
FIG. 23 is a plan view of an eighth embodiment of the present invention.

FIG. 23 shows an eighth embodiment of the present invention. In this embodiment, the depth of a slit 150 formed at a flat portion 152 is made great enough to reach a lower portion of a waveguide 151 for performing the wavefront division of a field distribution in a horizontal direction and the length of the slit 150 in the horizontal direction only extends to a center of the field distribution.

Figure 24:
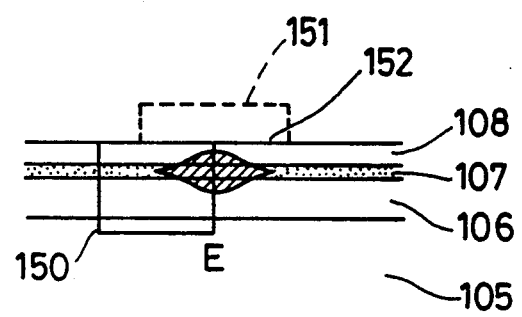
FIG. 24 is a cross-sectional view taken along a line D—D' of FIG. 23.

As shown in FIG. 24 which is a cross-sectional view of FIG. 23 taken along a line D—D', the depth of the slit 150 reaches a portion below the field distribution in the vertical direction indicated by hatching.

In the eighth embodiment, no strict accuracy control is necessary for the fabrication depth of the slit 150, but an enhanced accuracy is required for a shape of horizontal ends, especially, of the end E at a central portion of the waveguide 151.

Figure 25:
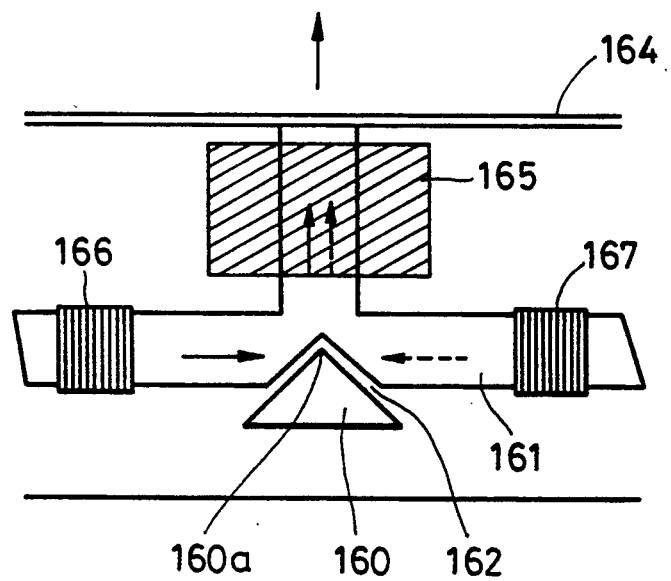
FIG. 25 is a plan view of a ninth embodiment of the present invention which is directed to a light transmitter device for wavelength multiplexing.

FIG. 25 shows an ninth embodiment of the present invention. In this embodiment, an etched portion or recess portion 160 of an isosceles triangle shape is formed at a flat portion 162, instead of a fine slit. Its vertex 160a is set at a central portion of a field distribution in a horizontal direction and the depth of the recess portion 160 extends to a lower portion of the field distribution in a direction of layered layers.

In the eighth embodiment, light waves of wavelength $\lambda_1$ and $\lambda_2$ emitted from DFB laser structures 166 and 167 are multiplexed by the branching coupler 160 and amplified by an optical amplifier structure 165. Then the amplified light or two-wavelength multiplexed optical signals are output through an output end surface coated with an AR coat 164.

Figure 26:
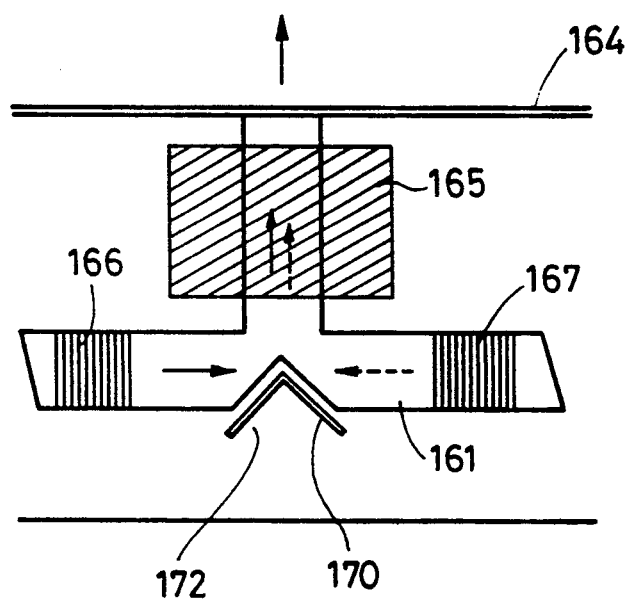
FIG. 26 is a plan view of a modification of the ninth embodiment.

FIG. 26 shows a modification of the eighth embodiment. In the modification, a V-shaped slit 170 is formed at a flat portion 172. The depth of the slit 170 also extends to a lower portion of a field distribution in a direction of layered layers, and hence the same technical advantages as the eighth embodiment are obtained.

In the eighth embodiment, the coupler 170 is formed by regional etching, so that etchings such as RIBE can be used. As a result, the productivity can be enhanced compared with a slit type coupler which needs to be produced, for example, by etching of FIBE.

In the above-discussed embodiments, a portion at which a coupler is to be formed is beforehand made flat, so that the controllability (espetially uniformity) of the depth of a coupler, which normally becomes a difficult problem when a wavefront division type coupler is to be produced, can be improved extremely. Thus, a branching ratio and coupling efficiency of a coupler can be stabilized.

Further, since a flat portion at which a coupler is formed is nearer to a waveguide layer, the fabrication accuracy of a coupler can further be enhanced and the fabrication time can be shortened. Thus, the yield can be improved.

FIG. 27 shows an example in which the device mentioned above is used as an optical node in an optical communication system. In FIG. 27, a plurality of terminals $188_1$, $188_2$, ..., $188_n$ are connected to an optical fiber 186 to transmit light signals, through optical nodes $187_1$, $187_2$, ..., $187_n$. Connected to respective terminals are terminal units $189_1$, $189_2$, ..., $189_n$ which respectively include a keyboard, a display device and so forth. Each terminal has a light signal transmitter including a modulator circuit 183, a laser light source 182 and a light signal receiver comprising a photodetector 180 and a demodulator circuit 181. The transmitter and receiver are controlled by a controller 184 in accordance with an instruction from the terminal unit $189_1$. The device as shown in FIG. 14 can preferably be used as the optical node $187_1$, $187_2$, ..., or $187_n$. Further, the device as shown in FIG. 21 can be used as a combination of the optical node 187, photodetector 180 and laser light source 182, and devices of FIGS. 18, 22, 25 and 26 can be used as the laser light source 182.

While there have been shown and described what are considered preferred embodiments of the present invention, it will be obvious to those skilled in the art that various changes and modifications may be made therein without departing from the invention as defined by the claims.

What is claimed is:

1. An optical device comprising:
   a substrate;
   a channel light waveguide formed on the substrate which confines a light in a horizontal direction and which propagates a light therethrough; and
   an optical coupler formed on a portion of the substrate where the channel light waveguide is not formed, said portion being arranged as an optical path and not including structure for confining a light in a horizontal direction, the coupler performing branching or combining of a light wave by splitting a wavefront of a field distribution of the light wave, the coupler comprising one of a slit and a recess which is formed by etching said portion.

2. An optical device according to claim 1, wherein said coupler is formed so that the splitting of the wavefront of the field distribution of the light wave is performed at least in a horizontal direction.

3. An optical device according to claim 1, wherein said waveguide includes a cross portion and wherein said coupler is formed at said cross portion.

4. An optical device according to claim 3, wherein said cross portion comprises one of a T-branch, X-branch and Y-branch portions.

5. An optical device according to claim 1, wherein said waveguide comprises a plurality of waveguide branches and includes a cross portion and wherein one of said waveguide branches is arranged to be connected to at least one of a light transmitter and receiver, and further comprising an optical amplifier area formed in another of said waveguide branches.

6. An optical device according to claim 1, wherein said coupler is formed so that the splitting of the wavefront of the field distribution of the light wave is effected at least in a vertical direction.

7. An optical device according to claim 1, wherein said waveguide has a ridge structure.

8. An optical device according to claim 1, wherein compound resonators are formed by coupling portions of said waveguide through said coupler.

9. An optical device according to claim 1, wherein said channel light waveguide includes an active layer, and wherein one of the slit or the recess extends in a vertical direction beyond said active layer.

10. An optical communication system comprising:
    a plurality of terminals;
    a transmitting line which transmits an optical signal between the terminals; and
    a plurality of optical nodes for connecting the terminals to the transmitting line, each of said optical nodes further comprising:
    a substrate;
    a channel light waveguide formed on the substrate which confines a light in a horizontal direction and which propagates a light therethrough; and
    an optical coupler formed on a portion of the substrate where the channel light waveguide is not formed, said portion being arranged as an optical path and not including structure for confining a light in a horizontal direction, the coupler performing branching or combining of a light wave by splitting a wavefront of a field distribution of the light wave, the coupler comprising one of a slit and a recess which is formed by etching said portion.

11. An optical communication system according to claim 10, wherein said each of said terminals comprises an optical transmitter and an optical receiver.

* * * * *

UNITED STATES PATENT AND TRADEMARK OFFICE
CERTIFICATE OF CORRECTION

PATENT NO. : 5,239,600
DATED : August 24, 1993
INVENTOR(S) : YUICHI HANDA, ET AL.

It is certified that error appears in the above-identified patent and that said Letters Patent is hereby corrected as shown below:

COLUMN 1
    Line 21, "laser" should read --laser,--.

COLUMN 2
    Line 52, "for" should read --to--.

COLUMN 3
    Line 57, "A-A'O" should read --A-A'--.

COLUMN 4
    Line 43, "EMBODIMENT" should read --EMBODIMENTS--.

COLUMN 5
    Line 57, "is" should read --are--.
    Line 67, "a" should read --an--.

COLUMN 6
    Line 3, "surface" should read --surfaces--.

COLUMN 7
    Line 21, "area 38b." should read --area 31b.--.

COLUMN 8
    Line 23, "of" should read --to--.

UNITED STATES PATENT AND TRADEMARK OFFICE
CERTIFICATE OF CORRECTION

PATENT NO.   : 5,239,600
DATED        : August 24, 1993
INVENTOR(S)  : YUICHI HANDA, ET AL.

It is certified that error appears in the above-identified patent and that said Letters Patent is hereby corrected as shown below:

<u>COLUMN 11</u>
    Line 12, "an" should read --a--.
    Line 40, "(espetially" should read --(especially--.

Signed and Sealed this

Seventh Day of June, 1994

Attest:

BRUCE LEHMAN

Attesting Officer      Commissioner of Patents and Trademarks